(12) United States Patent
Schneider

(10) Patent No.: US 6,720,663 B2
(45) Date of Patent: Apr. 13, 2004

(54) METHOD FOR MANUFACTURING AN INTEGRATED MEMORY CIRCUIT AND AN INTEGRATED MEMORY CIRCUIT

(75) Inventor: Stefan Schneider, München (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/206,305

(22) Filed: Jul. 26, 2002

(65) Prior Publication Data

US 2003/0072196 A1 Apr. 17, 2003

(30) Foreign Application Priority Data

Jul. 26, 2001 (DE) .......................................... 101 36 304

(51) Int. Cl.[7] .............................................. H01L 23/48
(52) U.S. Cl. .......................................... 257/778; 365/14
(58) Field of Search .................................. 257/777, 778

(56) References Cited

U.S. PATENT DOCUMENTS 5,313,097 A * 5/1994 Haj-Ali-Ahmadi et al. . 257/706
6,215,699 B1 * 4/2001 Yamamoto ............. 365/185.09
6,462,995 B2 * 10/2002 Urakawa ..................... 365/200

FOREIGN PATENT DOCUMENTS

DE 39 14 055 A1 10/1990

* cited by examiner

*Primary Examiner*—Son Mai
*Assistant Examiner*—Thao P. Le
(74) *Attorney, Agent, or Firm*—Laurence A. Greenberg; Werner H. Stemer; Gregory L. Mayback

(57) ABSTRACT

In a method for manufacturing an integrated memory circuit, a semiconductor substrate having a front side and a rear side is provided first. The semiconductor substrate is processed on the front side and on the rear side to produce memory cells on the front side and memory cells on the rear side of the semiconductor substrate. Finally, defective memory cells on one side of the semiconductor substrate are replaced by operational memory cells on the other side of the semiconductor substrate by connecting the operational memory cells of the one side of the semiconductor substrate to an input/output circuit of the memory circuit. By loading the semiconductor substrate on both sides, it is possible to either considerably reduce the rejection rate of memory chips or to strongly reduce the chip area of a memory chip or to increase the number of memory cells per specified chip area.

7 Claims, 1 Drawing Sheet

METHOD FOR MANUFACTURING AN INTEGRATED MEMORY CIRCUIT AND AN INTEGRATED MEMORY CIRCUIT

FIELD OF THE INVENTION

The present invention relates to memory circuits and, in particular, to integrated memory circuits.

BACKGROUND OF THE INVENTION AND PRIOR ART

Usually, integrated memory circuits are manufactured by providing a wafer, by subsequent processing of said wafer in order to produce the necessary doping structures and traces, and by finally dicing said wafer to obtain the individual memory chips. Then, the semiconductor memory chips are housed and shipped.

What is disadvantageous about the described procedure is the fact that, in particular during the manufacture of memory circuits, errors occur, which result in a memory chip having up to 30% of defective memory cells. After the memory manufacturer is informed about the typically expected error rate, e.g. a larger chip area than actually needed is used to obtain a one megabit memory chip in order to be able to compensate for the typically expected error rate by additional memory cells after manufacturing the memory. In a final functional test, the number of the defective memory cells will then be determined. If the number of defective memory cells may then be compensated by operational memory cells additionally present on the chip, a memory chip will pass the final quality control since the same has the specific value of for example one megabit.

What is disadvantageous about this procedure is the need to manufacture larger memory chips than actually needed right from the start in order to compensate for the post-productive defective memory cells. The chips are larger, meaning in other words, that less memory chips are obtained from one single wafer than if all memory cells were functional during memory manufacture and if for a one megabit memory chip only exactly the appropriate number of memory cells had to be manufactured. Here, it should be appreciated that a considerable share of the cost for the memory chips is not necessarily to be assigned to the development of memory chips but to the immense investment made by a semiconductor factory. If memory manufacture pays itself off or not rather depends on e.g. how many memory chips can be manufactured a day, provided that demand is accordingly great. Thus, as described above, if memory chips are provided with a larger design than actually needed, in order to compensate for unavoidable defects, the output in memory chips per wafer will decrease, which will have an immediate effect on the price of memory chips or even on profit and, thus, on the profitability for the memory manufacturer.

SUMMARY OF THE INVENTION

It is an object of the present invention to provide an inexpensive concept for the manufacture of integrated memory circuits as well as inexpensive integrated memory circuits.

In accordance with the present invention, this object is achieved by a method for manufacturing an integrated memory circuit, comprising the following steps: providing a semiconductor substrate having a front side and a rear side; processing the front side and the rear side of the semiconductor substrate to produce memory cells on the front side and to produce memory cells on the rear side of the semiconductor substrate; and replacing of defective memory cells on one side of the semiconductor substrate by operational memory cells on the other side of the semiconductor substrate by connecting the operational memory cells on the other side of the semiconductor substrate to an input/output circuit of the memory circuit.

The present invention is based on the finding that yield may be considerably increased by no longer processing the semiconductor wafer on one side, as in the state of the art, but by providing both sides of the wafer with memory circuits. An inventive integrated memory circuit does not only have memory cells and conductive traces on one side but is also provided with memory cells and conductive traces on the other.

An advantage of the present invention is that, as compared to the state of the art, it is possible to double the number of memory cells per chip area.

Assuming that memory cell defects are randomly distributed, the simultaneous occurrence of errors on both sides of the memory chip is considerably lower, since probabilities, which are typically values of much less than one, multiply themselves, which results in a total error probability which is much less than the probability of one side of the wafer being defective. Here, the error probability may also be construed such that a memory chip may be classified as defective due to a number of memory cells which is too large in total, i.e. that the memory chip itself will not pass the final quality control.

One further advantage of the present invention is that the chip area of a memory chip does not need to be made larger than actually required due to defects made during the manufacture, but that it may even be reduced significantly since the inventive integrated memory circuit comprises memory cells on both sides.

BRIEF DESCRIPTION OF THE DRAWINGS

Preferred embodiments of the present invention are described in detail below with reference to the attached figure, in which.

DETAILED DESCRIPTION OF PREFERRED EMBODIMENTS

Figure 1:
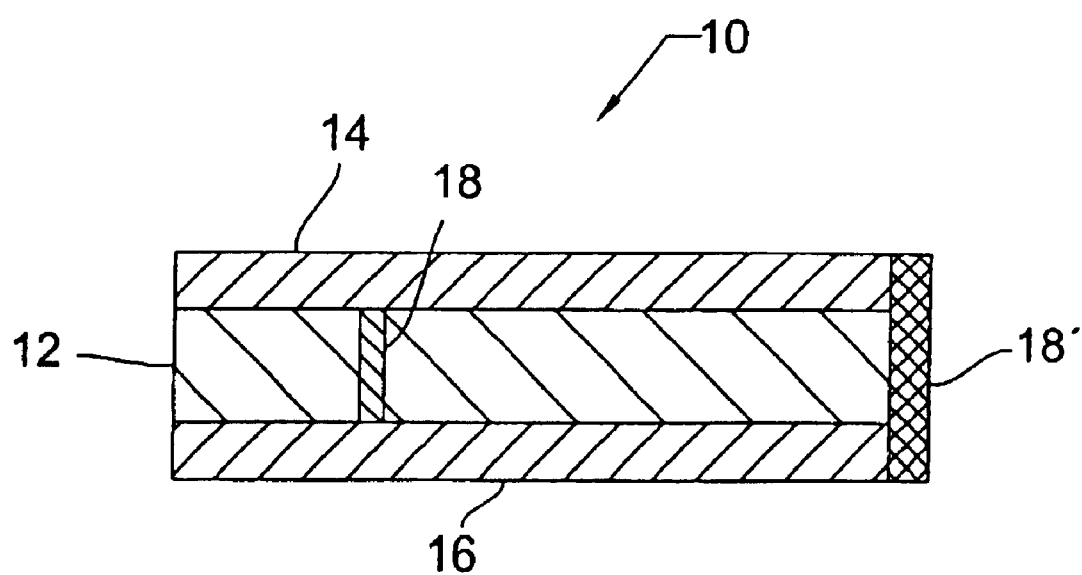
FIG. 1 shows an integrated memory circuit comprising memory cells on both wafer sides.

The only figure shows an inventive integrated memory circuit 10 with a semiconductor substrate 12 and memory cells 14 on the front side of the semiconductor substrate and further memory cells 16 on the rear side of the semiconductor substrate 12. The inventive memory circuit further includes a connecting structure 18 and/or 18' for connecting operational memory cells on one side of the semiconductor substrate in an input/output area of the integrated memory circuits in order to replace defective memory cells on the other side of the semiconductor substrate. The connecting structure may either be implemented as a chip via contact structure 18 or as a contact structure 18' on the edge of the chip. By way of this connecting structure, defective memory cells on the front side of the wafer are typically replaced by intact memory cells on the rear side of the wafer by connecting, instead of the defective memory cells of the one side, the operational memory cells of the other side to an input-output area of the integrated memory circuit.

In accordance with the invention, therefore, by loading a semiconductor wafer on both sides, the yield increase rises.

Assuming that errors are randomly distributed, the probability of an error occurring simultaneously on both sides is at the same time much lower. When designating the error probability, in case of one-sided loading, with p, the error probability in case of two-sided loading will be $p^2$. Since the probability p is a value between 0 and 1 and typically much less 1, the squared error probability is considerably smaller than the simple error probability p and is, in particular, much less than 1. In accordance with the invention, use is thus made of the independence in loading the semiconductor substrate on both sides. This independence does not only apply for non-directional processes, such as e.g. diffusion processes, but also for directional processes, such as e.g. electron-beam writing for manufacturing a memory circuit. While, for diffusion driven processes, such as e.g. doping steps etc., the wafer could be processed from both sides at the same time, this is not possible for directional processing steps, such as e.g. exposures, electron-beam writing operations etc. In this case, typically one side of the wafer is processed first and then, after turning the wafer around, the other side to generate memory cells on both sides of the semiconductor substrate.

It is preferred to process both wafer sides in an exact symmetrical manner such that, for processing the rear side of the wafer, no other masks, parameters etc. have to be set, but that, for processing the rear side of the wafer, the wafer simply has to be turned around.

Depending on a processing step being a directional of non-directional processing steps, both wafer sides may be processed sequentially or at the same time.

By the inventive concept of processing a semiconductor substrate on both sides, to generate useful structures on both sides, the chip area of a memory chip may be considerably decreased or the rejection rate may be considerably reduced, while maintaining the same chip area. Moreover, while maintaining the chip area, a memory chip having a higher memory performance than in case of one-sided loading may be manufactured.

LIST OF REFERENCE NUMERALS

10 Integrated memory circuit
12 Semiconductor substrate
14 Memory cells on the front side of the semiconductor substrate
16 Memory cells on the rear side of the semiconductor substrate
18 Through-hole
18' Metallization at the edge of the dices memory chip

What is claimed is:

1. Method for manufacturing an integrated memory circuit, comprising the following steps:

providing a semiconductor substrate having a front side and a rear side;

processing the front side and the rear side of the semiconductor substrate to produce memory cells on the front side and to produce memory cells on the rear side of the semiconductor substrate; and replacing of defective memory cells on one side of the semiconductor substrate by operational memory cells on the other side of the semiconductor substrate by connecting the operational memory cells on the other side of the semiconductor substrate to an input/output circuit of the memory circuit.

2. Method in accordance with claim 1, wherein the front side and the rear side of the semiconductor substrate are processed simultaneously.

3. Method in accordance with claim 1, wherein the semiconductor substrate on the front side and on the rear side are processed in an identical manner.

4. Method in accordance with claim 1, wherein, during the step of replacing, the step of connecting the operational memory cells may be performed by a metallization structure at the edge of a diced semiconductor chip.

5. Method in accordance with claim 1, wherein, during the step of replacing, the step of connecting the operational memory cells through through-holes through the semiconductor substrate is performed.

6. Integrated memory circuit, comprising:

a semiconductor substrate having a front side and a rear side;

memory cells integrated in the semiconductor substrate which are located on the front side and on the rear side of the semiconductor substrate; and a connecting structure for connecting operational memory cells on one side of the semiconductor substrate to an input/output region of the integrated memory circuit to replace defective memory cells on the other side.

7. Integrated memory circuit in accordance with claim 6 wherein the semiconductor substrate is dimensioned such that a predetermined number of memory cells may be accommodated on one side of the semiconductor substrate, the predetermined number being specified by a specification for the integrated memory circuit.

\* \* \* \* \*